US006744927B1

United States Patent
Kato

(10) Patent No.: US 6,744,927 B1
(45) Date of Patent: Jun. 1, 2004

(54) DATA COMMUNICATION CONTROL APPARATUS AND ITS CONTROL METHOD, IMAGE PROCESSING APPARATUS AND ITS METHOD, AND DATA COMMUNICATION SYSTEM

(75) Inventor: Masami Kato, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/469,798

(22) Filed: Dec. 22, 1999

(30) Foreign Application Priority Data

Dec. 25, 1998 (JP) .............................. 10-371478

(51) Int. Cl.[7] .................... G06K 9/36; H04L 12/16; G06F 15/16
(52) U.S. Cl. ................... 382/239; 370/263; 709/204
(58) Field of Search ................... 382/235, 239–250, 382/232, 166, 251; 358/430, 433; 375/240.12, 240.26; 370/263; 709/204, 203, 217

(56) References Cited

U.S. PATENT DOCUMENTS

| | | | | |
|---|---|---|---|---|
| 4,951,140 A | * | 8/1990 | Ueno et al. | 348/413.1 |
| 5,675,374 A | * | 10/1997 | Kohda | 348/14.1 |
| 5,991,445 A | | 11/1999 | Kato | 382/232 |
| 6,112,233 A | * | 8/2000 | Xu | 709/217 |
| 6,181,711 B1 | * | 1/2001 | Zhang et al. | 370/468 |
| 6,343,313 B1 | * | 1/2002 | Salesky et al. | 709/204 |
| 6,351,568 B1 | * | 2/2002 | Andrew | 382/239 |

OTHER PUBLICATIONS

Yokoo et al., "Extraction of Plural Face Areas from a Natural Image by Using Genetic Algorithm", The Institute of Electrical Engineers of Japan Procs. C., vol. 117–C, No. 9, Sep. 1997, pp. 1245–1252.

* cited by examiner

Primary Examiner—Wenpeng Chen
(74) Attorney, Agent, or Firm—Fitzpatrick, Cella, Harper & Scinto

(57) ABSTRACT

In video conference system terminals, the conventional difficulty in high-quality display of facial expressions of a plurality of participants is solved. In a multipoint connection device connecting a plurality of video conference terminals, image data transmitted from a terminal is decoded, and a face area in the image data is recognized. Then, quantization coefficients for the face area are set to be greater coefficients than those for other areas than the face area, then the image data is compressed, and delivered to the respective terminals. By this arrangement, in image data, a face area with great significance can be re-compressed without degradation of image quality, while an area with less significance such as background can be compressed with high efficiency. Thus, the total code amount can be reduced. Accordingly, even if the system uses a narrow band communication channel, the significant face area can be clearly displayed at the respective terminals.

14 Claims, 12 Drawing Sheets

FIG. 8

| 1 | 1 | 1 |
|---|---|---|
| 1 | 1 | 1 |
| 1 | 1 | 1 |

FIG. 10 PRIOR ART
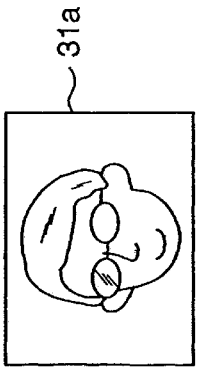
31a
31b
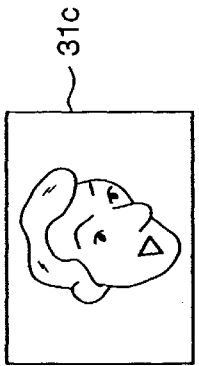
31c
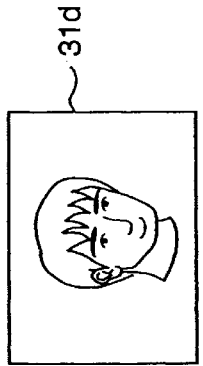
31d
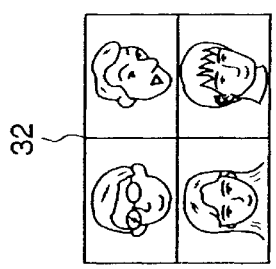
32

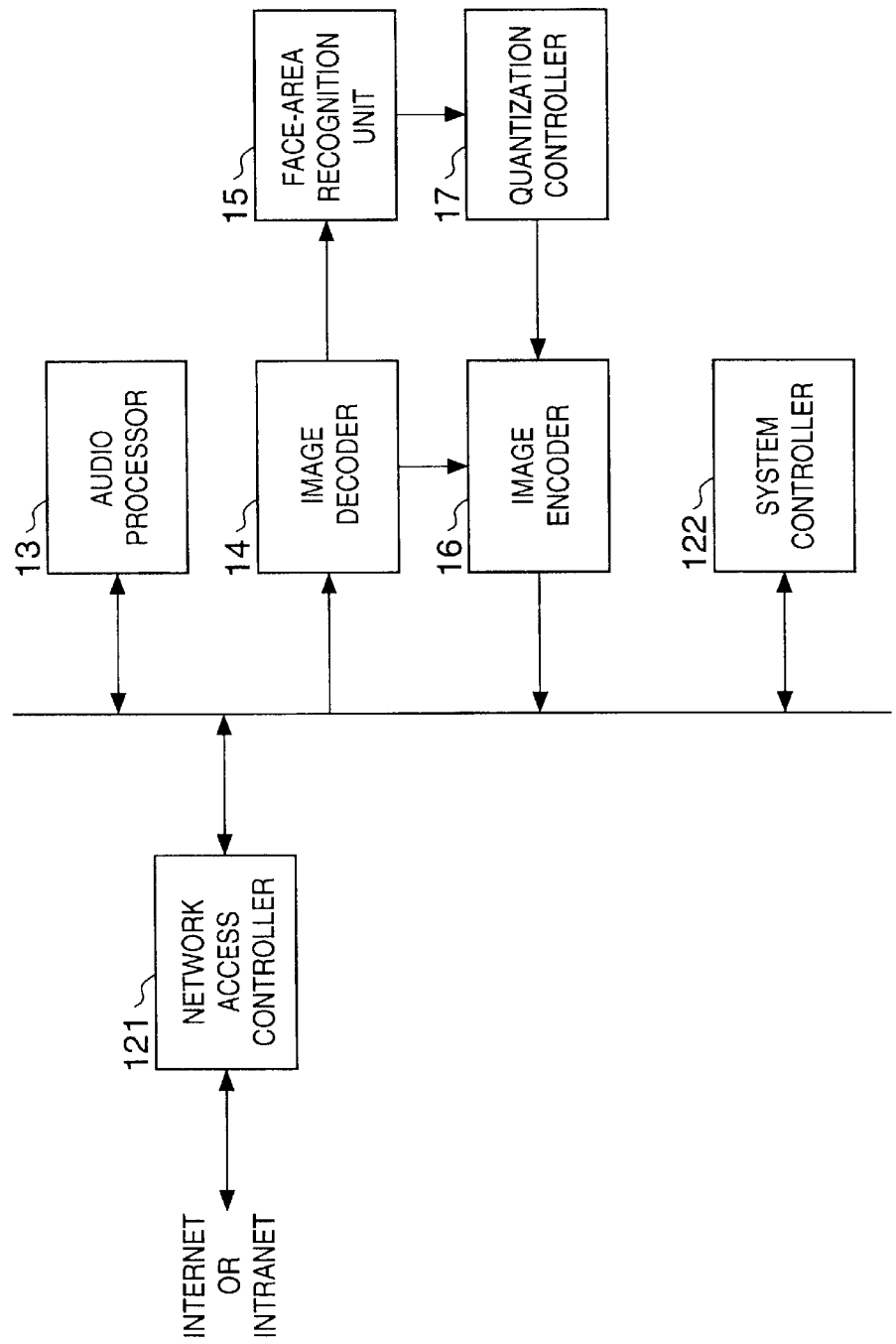

DATA COMMUNICATION CONTROL APPARATUS AND ITS CONTROL METHOD, IMAGE PROCESSING APPARATUS AND ITS METHOD, AND DATA COMMUNICATION SYSTEM

BACKGROUND OF THE INVENTION

The present invention relates to a data communication control apparatus and its control method, an image processing apparatus and its method, and a data communication system which realize interactive video communication among a plurality of points.

A multipoint video conference system widely used now enables video conference terminals based on the ITU-T Recommendation H. 320 and the like to perform interactive communication among a number of points via a multipoint connection device.

As standards related to the multipoint connection device to control such multipoint connection among video conference terminals, the ITU-T Recommendation H. 231 defining the functional construction of the multipoint connection device and the format of multipoint communication, the ITU-T Recommendation H. 243 determining an in-channel communication procedure and the like have been made.

FIG. 1 shows the construction of a conventional video conference system. In FIG. 1, a multipoint connection device 22 interconnects video conference terminals 21a to 21n at three or more points, and performs audio mixing, video data delivery control or video data combining for split screen view, further, performs presidential control over the conference. In this manner, a multipoint conference connecting a plurality of remote points can be realized by connecting terminals via a multipoint connection device as long as the terminals are based on the Recommendation H. 320.

To realize multipoint interactive video communication in a video conference system based on the Recommendation H. 320, to deliver image data from the multipoint connection device 22 to the video conference terminals 21a to 21n as shown in FIG. 1, the following methods (1), (2) and the like have been put into practical use:

(1) A method to deliver a video image from a specific video conference terminal designated by a presidential terminal to the respective video conference terminals.

(2) As shown in FIG. 10, a method to reduce video images from respective video conference terminals 21a to 21n in the multipoint connection device 22, so as to simultaneously deliver images from respective video conference terminals 21a to 21n within a limited band.

Note that in FIG. 10, numerals 31a to 31d denote video data transmitted from the respective video conference terminals 21a to 21d; 32, reduced and synthesized video data delivered from the multipoint connection device 22 to the respective video conference terminals 21a to 21d.

Further, to realize a video conference system in an Internet environment, software programs such as CU-SeeMe by White Pine Software, Inc. have been provided. In the multipoint video conference system, image data transmitted from the respective client terminals are delivered via a multipoint connection server to the respective client terminals without any processing. FIG. 11 shows video data transfer in this system. In FIG. 11, numerals 41a to 41c denote client terminals realized by personal computers or the like having video and audio input/output functions; 42, a multipoint connection server which delivers video and audio data from the respective client terminals 41a to 41c to the client terminals 41a to 41c without any processing.

However, the conventional video conference system using the multipoint connection based on the Recommendation H. 320 or the like, in which communication is performed within a limited band to the respective terminals, has problems as follows.

(1) Only the video image of a particular reference participant is delivered; or (2) As reduced images of plurality of participants are transmitted, the images of the respective speakers are unclear.

In the video conference terminal, it is difficult to simultaneously and clearly display a plurality of conference participants.

Further, in the video conference system utilizing the Internet as shown in FIG. 11, the multipoint connection server 42 delivers video and audio data from the respective client terminals 41a to 41c to the client terminals 41a to 41c without any processing. For example, between the multipoint connection server 42 and the client terminal 41a, the client terminal 41a transmits terminal information A to the multipoint connection server 42, and the multipoint connection server 42 transfers terminal information B and C from other client terminals 41b and 41c to the client terminal 41a. Accordingly, the code amount of the image data delivered from the multipoint connection server 42 to the client terminals 41a to 41c increases in proportion to the number of conference participants (terminals). If a sufficient band is not ensured as a communication channel, the frame rate of images received by the client terminals 41a to 41c is extremely reduced. Accordingly, to display a received image, so-called frame thinning, i.e., omitting a frame at predetermined intervals, must be performed.

SUMMARY OF THE INVENTION

Accordingly, it is an object of the present invention to provide a data communication control apparatus and its control method and a data communication system which enable high-quality image communication. It is another object of the present invention to provide a data communication control apparatus and its control method and a data communication system which enables image communication without degration of the quality of the important portion of an image even if using a narrow band communication channel.

According to the present invention, the foregoing objects are attained by providing a data communication control apparatus comprising: compression means for compressing image data to be transmitted; communication means for transmitting the image data compressed by the compression means to the terminals; recognition means for recognizing a specific area in the image data; and compression control means for controlling a compression method in the compression means in accordance with whether or not an object area in the image data is the specific area.

It is another object of the present invention to provide a data communication control apparatus and its control method and a data communication system which enable clearly displayed facial expressions of participants in a multipoint video conference system.

According to the present invention, the foregoing object is attained by providing the data communication control apparatus wherein the specific area is an area showing a person's face.

It is further object of the present invention to provide an image processing apparatus and its method which mitigate degradation of image quality upon reuse of compressed image data.

According to the present invention, the foregoing object is attained by providing an image processing apparatus comprising: recognition means for recognizing a specific area in an image represented by compressed image data; and compression control means for controlling a re-compression method for re-compressing the compressed image data based on recognition by the recognition means.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 is an example of a spatial filter;

FIG. 10 is an example of image processing by the conventional multipoint connection device.

FIG. 12 is a block diagram showing the another construction of a multipoint connection device.

DETAILED DESCRIPTION OF THE PREFERRED EMBODIMENTS

Preferred embodiments of the present invention will now be described in detail in accordance with the accompanying drawings.

First Embodiment

Figure 1:
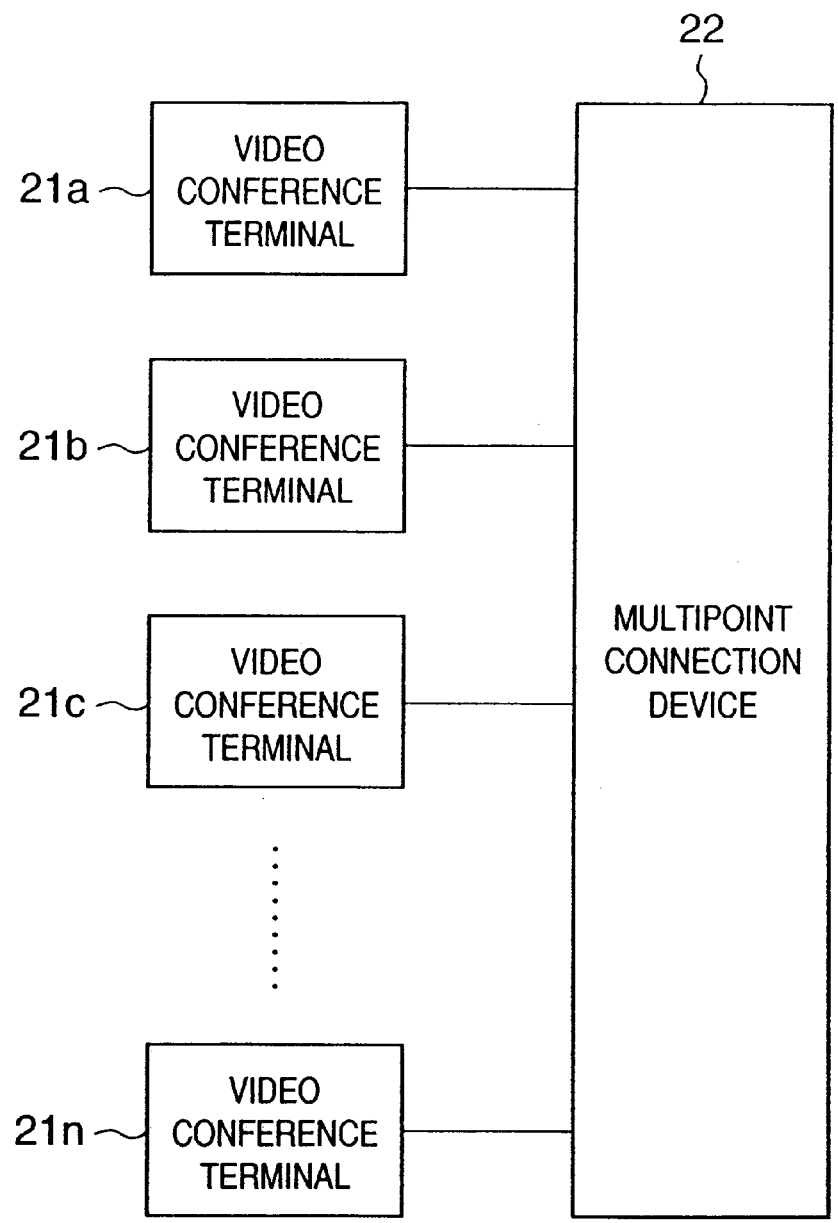
FIG. 1 is a block diagram showing the construction of a multipoint video conference system according to a first embodiment of the present invention.

The basic construction of a video conference system according to a first embodiment of the present invention is similar to that of the above-described prior art as shown in FIG. 1. The video conference terminals 21a to 21n (hereinbelow, simply referred to as "terminals") at three or more points are interconnected via the muitipoint connection device 22. Image data outputted from the respective terminals 21a to 21d are delivered to the other terminals via the multipoint connection device 22.

Figure 2:
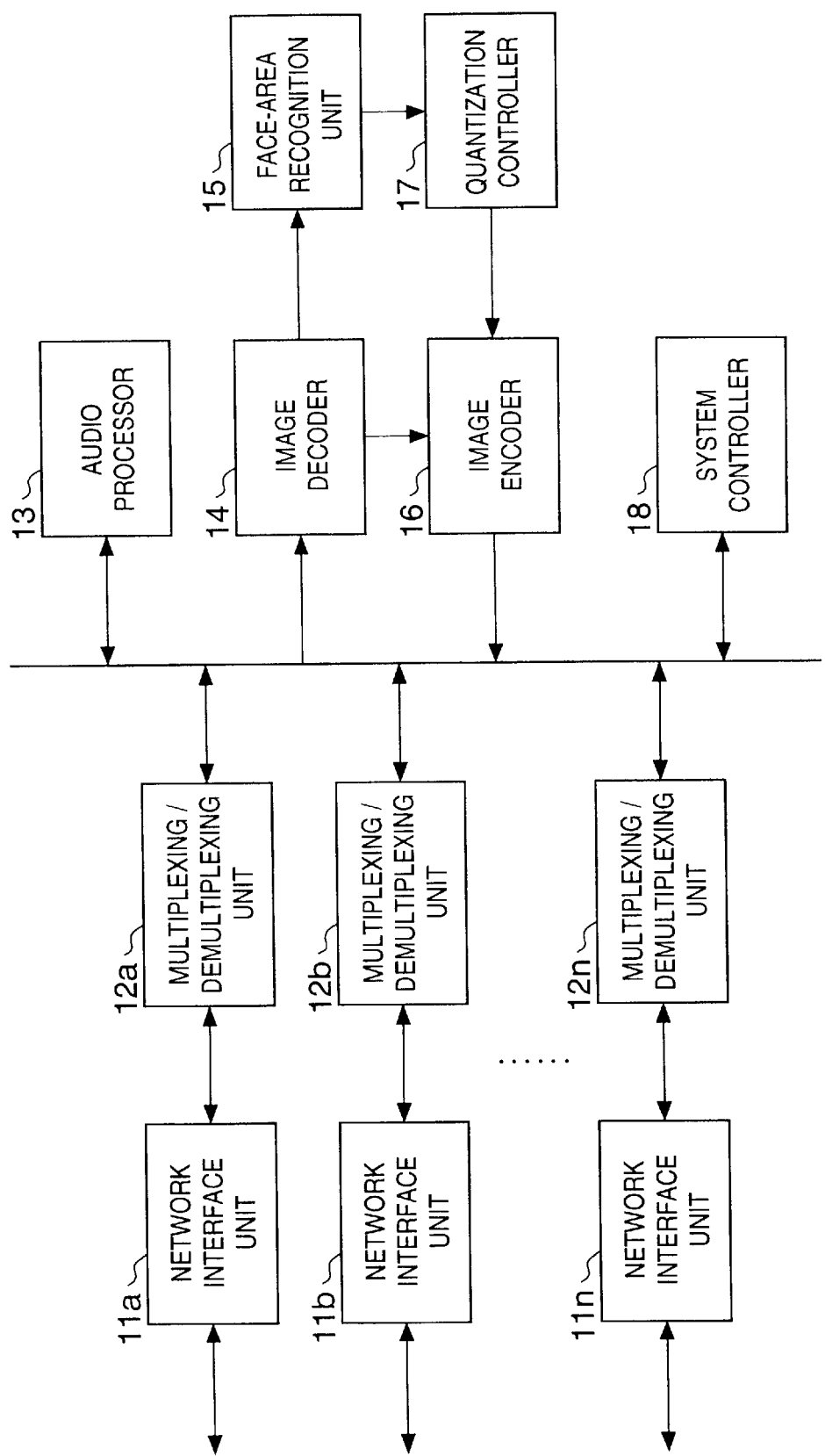
FIG. 2 is a block diagram showing the basic construction of a multipoint connection device.

FIG. 2 is a block diagram showing the basic construction of the multipoint connection device 22 in the present embodiment. In FIG. 2, numerals 11a to 11n denote network interface units for accommodating the remote terminals 21a to 21n, as line interfaces for ISDN, PSTN and the like; and 12a to 12n, multiplexing/demultiplexing units which perform multiplexing/demultiplexing on various image, audio and control data in accordance with, e.g., the ITU-T Recommendation H.221. Note that in the multipoint connection device 22, the number of the network interface units 11a to 11n and that of the multiplexing/demultiplexing units 12a to 12n correspond to the number of video conference terminals which can be directly connected to the multipoint connection device. Further, the multipoint connection device 22 can be connected to another multipoint connection device, a server or the like via the network interface units 11a to 11n and the multiplexing/demultiplexing units 12a to 12n.

Numeral 13 denotes an audio processor which performs decompression/mixing processing on audio code data, transmitted from the respective terminals 21a to 21n and demultiplexed by the multiplexing/demultiplexing units 12a to 12n, then performs compression encoding on the data again, and delivers the data to the respective terminals 21a to 21d. Numeral 14 denotes an image decoder which decodes compressed image code data demultiplexed by the multiplexing/demultiplexing units 12a to 12n, thus generating uncompressed image data.

Numeral 15 denotes a face-area recognition unit which recognizes a face area of a person from image data decoded by the image decoder 14; 16, an image encoder which again compresses the image data decoded by the image decoder 14; and 17, a quantization controller which performs quantization control upon re-compression by the image encoder 16, in accordance with the result of face area recognition by the face-area recognition unit 15. More specifically, a plurality of quantization tables are prepared, and if it is determined that a quantization object image is not a face area image, a quantization table is selected such that coefficients of the table are set for a quantization step greater than that used in decoding.

Numeral 18 denotes a system controller which performs various communication protocol processing and the entire operation of the multipoint connection device 22.

Figure 3:
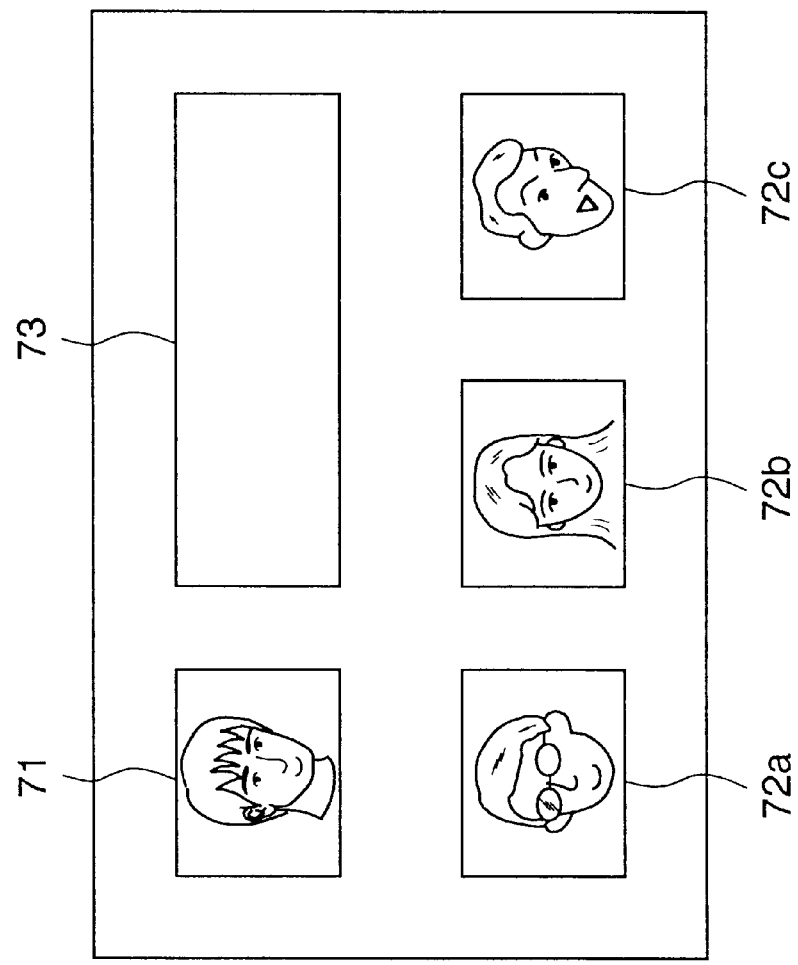
FIG. 3 is an example of display screen of a video conference terminal.

FIG. 3 is an example of an image displayed on the terminals 21a to 21n in the multipoint video conference system of the present embodiment. Assuming that the image in FIG. 3 is a displayed image on the terminal 21d, numeral 71 denotes a window to display a video image of a user of the terminal 21d; 72a to 72c, windows to display video images of users of the other terminals (e.g., 21a to 21c) as participants of the conference; and 73, a common window in the conference to display, e.g., a white board.

Next, image processing by the multipoint connection device 22 will be described in detail with reference to the flowchart of FIG. 4.

Multiplexed multimedia data sent via the communication interface units 11a to 11n accommodating the terminals 21a to 21n are frame-demultiplexed by the multiplexing/demultiplexing units 12a to 12n, and audio compressed data, video compressed data, data conference low-speed data, system control data and the like are extracted (step S1001). Hereinbelow, processing on the demultiplexed video compressed data will be described.

Note that the demultiplexed audio compressed data is decompressed by the audio processor 13, and mixed with other decompressed audio data demultiplexed by the respective multiplexing/demultiplexing units 12a to 12n. Then, the mixed audio data is compressed, multiplexed with other data such as image data by the multiplexing/demultiplexing units 12*a* to 12*n*, and delivered to the respective terminals 21*a* to 21*n*.

The system controller 18 determines whether or not code amount control is performed on the demultiplexed video compressed data in accordance with an instruction from a terminal as a delivery destination of the data (step S1002). If the code amount control is not performed, the video compressed data is multiplexed again with other data by the multiplexing/demultiplexing units 12*a* to 12*n* (step S1008). In this arrangement, regarding a video image from a specific terminal, specified by a user, if the user instructs not to preform the above-described code amount control, the video image can be delivered as a fine image with a clear background image.

On the other hand, if the code amount control is performed, the video compressed data is decoded by the image decoder 14 (step S1003), and temporarily stored in a RAM (not shown) or the like in the image decoder 14. Then the face-area recognition unit 15 performs face area recognition processing on the decoded image data (step S1004). Note that as the face area recognition by the face-area recognition unit 15, an area including a person's face can be recognized by, e.g., a method described in "Extraction of Plural Face Areas from a Natural Image by Using Genetic Algorithm" (Yokoo and Hagiwara, The Institute of Electrical Engineers of Japan Proceedings C, Vol. 117-C, No. 9, September 1997) or the like.

Note that in the present embodiment, the face area recognition method is not limited to any particular method, but any method can be used. A higher level recognition method such as extraction of exact face area outline can be employed as long as the multipoint connection device has sufficiently high processing capability. Further, in some face area recognition method, it is not necessary for the image decoder 14 to completely decode the image data.

After the face area recognition, the decoded image data is re-compressed by the image encoder 16. In the present embodiment, upon compression processing, the quantization coefficients are controlled based on the result of face area recognition.

The result of face area recognition is outputted to the quantization controller 17. The quantization controller 17 has quantization coefficients used in decoding by the image decoder 14 (or Q factors for quantization) and quantization coefficients multiplied by n (n>1). Note that the former quantization coefficients are set as default coefficients.

Regarding an area determined at step S1005 as a non-face area, the quantization coefficients having the set default values are changed to the quantization coefficients multiplied by n (step S1006). Note that regarding an area determined as a face area, the same quantization coefficients (default values) as those in the decoding are used.

Then, the image encoder 16 performs quantization based on the set quantization coefficients on the image data held in the image decoder 14, thus performing compression processing (step S1007).

In this arrangement, a face area with great significance is re-compressed without degrading image quality, while an area other than the face area such as background with less significance is compressed by a greater quantization step. Thus the total code amount can be reduced.

The multipoint connection device 22 performs the above processings independently on data transferred from the respective terminals 21*a* to 21*n*. Note that the re-compressed image data are multiplexed with the audio compressed data by the multiplexing/demultiplexing units 12*a* to 12*n* (step S1008), and delivered to the respective terminals 21*a* to 21*n* in accordance with a communication protocol.

Figure 5:
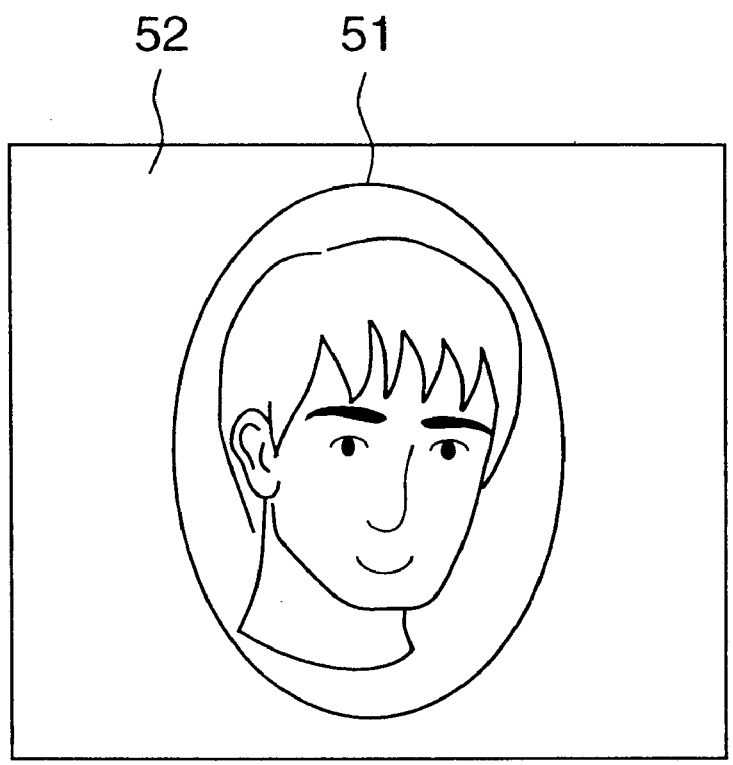
FIG. 5 is an example of image delivered in the first embodiment.

FIG. 5 is an example of displayed image, obtained by e.g. a camera (not shown) of the terminal 21*d*, then processed by the multipoint connection device 22 as described above, and delivered to the respective terminals 21*a* to 21*n*, in the video conference system of the present embodiment. In FIG. 5, an area in a circle 51 is recognized as a face area; and an area 52 is a background area recognized as a non-face area. The background area 52, quantized by a greater quantization step, becomes a low-resolution image, while the face area 51 has image quality equivalent to that of an image obtained by the terminal 21*d*.

As described above, according to the present embodiment, in a video conference system, only a significant portion of an image obtained by a terminal can be transmitted with high precision to the respective terminals of video conference system. Accordingly, even if the respective terminals are connected by a narrow band communication channel, the significant portion can be transmitted in high-quality image communication. At the respective terminals, in an image transferred from another terminal, a significant portion, face area, i.e., the facial expression of the user of the other terminal can be clearly displayed without reduction or frame thinning.

Further, in response to an instruction from a terminal, an image from another arbitrary terminal may be received as an entirely high quality image at any time.

Note that the decoding processing and the encoding processing in the present embodiment may be performed in predetermined image data block units. In this case, the above-described processings at steps S1003 to S1007 are repeated in each block.

Further, an area where high image quality is maintained is not limited to a face area. The same advantage as that of the present embodiment can be obtained by setting an arbitrary significant object as an object of high-precision display in accordance with the content of conference, and transferring other image areas with degraded image quality.

Second Embodiment

Next, a second embodiment of the present invention will be described.

As the basic construction of the video conference system of the second embodiment is similar to that of the first embodiment as shown in FIG. 1, the explanation of the construction will be omitted.

Figure 6:
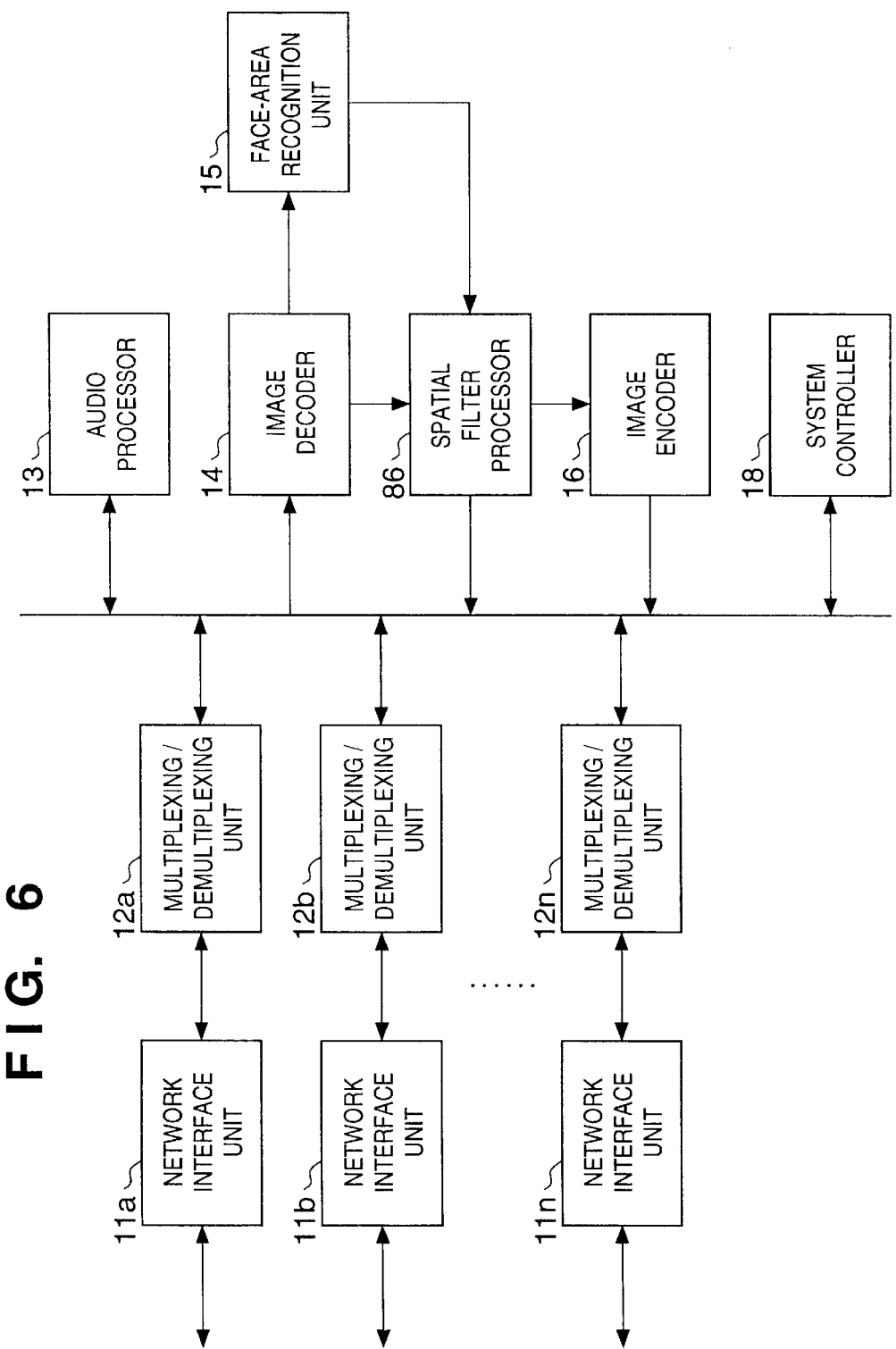
FIG. 6 is a block diagram showing the basic construction of the multipoint connection device according to a second embodiment of the present invention.

FIG. 6 is a block diagram showing the construction of the multipoint connection device 22 according to the second embodiment of the present invention. In FIG. 6, constituents corresponding to those in FIG. 2 have the same reference numerals and the explanations of these constituents will be omitted.

In FIG. 6, numeral 86 denotes a spatial filter processor which performs low-frequency filter processing on decoded image data based on the result of recognition by the face-area recognition unit 15. More specifically, the spatial filter processor 86 performs spatial filter processing on areas other than a face area by a low-pass filter, to attenuate high frequency components.

Figure 7:
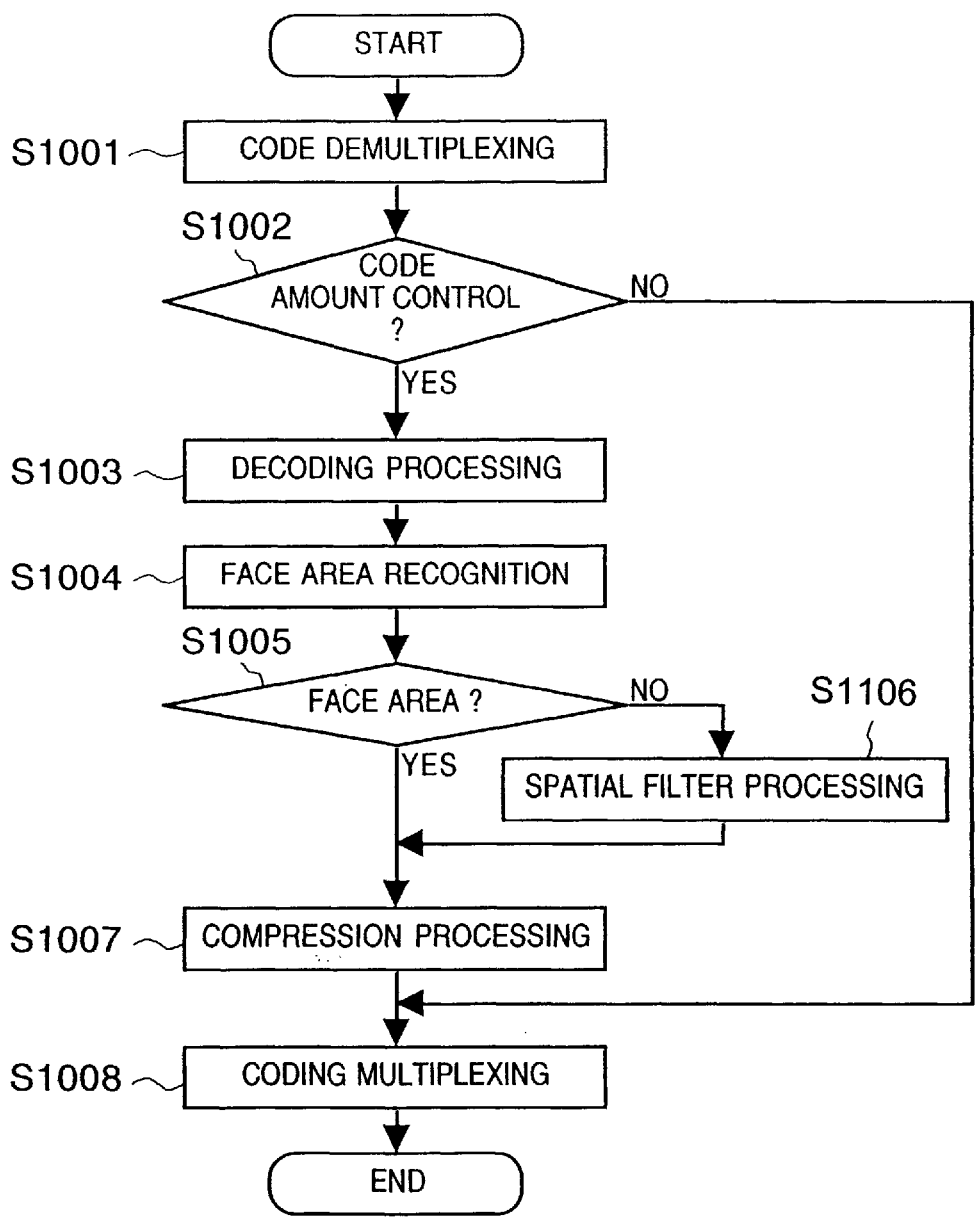
FIG. 7 is a flowchart showing image processing by the multipoint connection device.

Next, the image processing by the multipoint connection device 22 according to the second embodiment will be described in detail with reference to the flowchart of FIG. 7. Note that steps corresponding to those in FIG. 4 have the same step numbers, and the explanations of those steps will be omitted.

As in the case of the first embodiment, after the face area recognition at step S1004, the decoded image data is re-compressed by the image encoder 16. In the present embodiment, upon this compression processing, spatial filter processing is performed based on the result of face area recognition.

The spatial filter processor 86 inputs decoded image data and the result of face area recognition. In the spatial filter processor 86, a low-pass filter is prepared in advance, and spatial filter processing by the low-pass filter is performed (step S1106) on an area determined at step S1005 as a non-face area. Then, the spatial filter processed image data is compressed by the image encoder 16 (step S1008).

Figure 8:
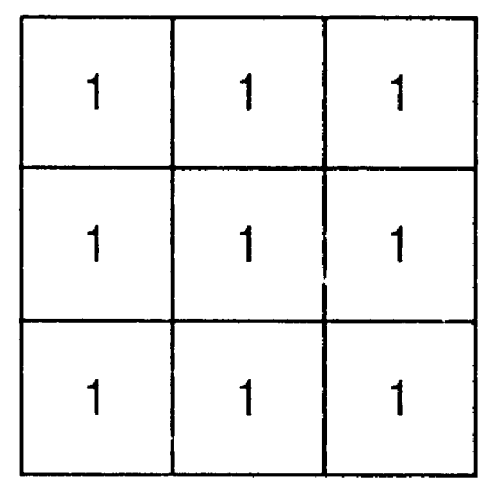

FIG. 8 is an example of the low-pass filter in the spatial filter processor 86. The filter processing expressed by the following equation (1) is performed by using the low-pass filter.

$$P'(x,y)=(P(x-1,y-1)+P(x,y-1)+P(x+1,y-1)+P(x-1,y)+P(x,y)+(x+1,y)+P(x-1,y+1)+P(x,y+1)+P(x+1,y+1)+P(x+1,y+1))/9 \quad (1)$$

Note that $P(x,y)$ is a pixel value of coordinates $(x,y)$.

Note that the spatial filter in the second embodiment is not limited to that as shown in FIG. 8, but any filter may be employed as long as it is a low-pass filter.

Further, in the second embodiment, execution/non-execution of spatial filter processing is controlled in accordance with whether or not an object area is a face area (specific area), however, the present invention is not limited to this arrangement. For example, spatial filter processing may be performed on a specific area and other areas. In this case, a low-pass filer used in the processing is selected in accordance with whether an object area is a specific area or not. A filter for the other areas than the face area is selected so as to remove high frequency components more than those in the face area removed by a filter for the face area.

As described above, according to the second embodiment, in image data, a specific area with great significance such as a face area is re-compressed without degrading image quality, and in areas other than the specific area with less significance such as background, high frequency components are attenuated. This reduces the total code amount, and accordingly, obtains the same advantage as that of the first embodiment.

Further, in the second embodiment, as the resolution of image is controlled by the spatial filter processing, degradation of image quality is visually more inconspicuous in comparison with the first embodiment where the code amount is reduced by control on quantization coefficients.

In the above-described first and second embodiments, in each of the images obtained by the respective video conference terminals, especially a face area is detected. In a case where the terminals respectively have a fixed camera which obtains an image with a fixed image sensing area, if the compression rate for a part around the center of the obtained image is set to a lower rate than the compression rate for other parts in advance, the object of the present invention can be attained without detecting a face area from the image.

However, in a case where a plurality of persons are image-sensed by such fixed camera, in an image from a terminal, the user of the terminal is not always positioned around the center of the image. Accordingly, in this case, if the image transfer is performed such that only a part around the center of the obtained image has high image quality, the transferred image is unnatural. For example, if only the half of the face of the user is included in a preset low compression rate area but the other half is included in a high compression rate area, it is impossible to transfer the image such that the entire face area has high image quality.

Accordingly, even if the terminals respectively have a fixed camera, to ensure high-quality face area transfer, a face area is extracted as a significant portion from an obtained image, as in the case of the above-described first and second embodiments.

Further, in a case where the terminals respectively have a camera in which its image sensing direction can be operated from another terminal, the camera of a terminal may be operated such that the user's face comes to the center of the obtained image. However, if the orientation of the camera can be arbitrarily operated from the opposite-end terminal side, an undesirable portion such as background other than a person's face might be arbitrarily image-sensed.

Accordingly, in case of image sensing by such remote-controllable camera, detecting a face area is rather advantageous than previously setting low compression rate area and high compression rate area within the obtained image. The face area detection unnecessitates operation of the orientation of the camera, and further ensures privacy protection for conference participants.

Third Embodiment

Next, a third embodiment of the present invention will be described. The basic construction of the video conference system of the third embodiment is similar to that of the first embodiment as shown in FIG. 1, therefore, the explanation of the construction will be omitted.

In the third embodiment, the principal processings of the multipoint connection device 22 having the functions as described in the first embodiment are realized by software.

Figure 9:
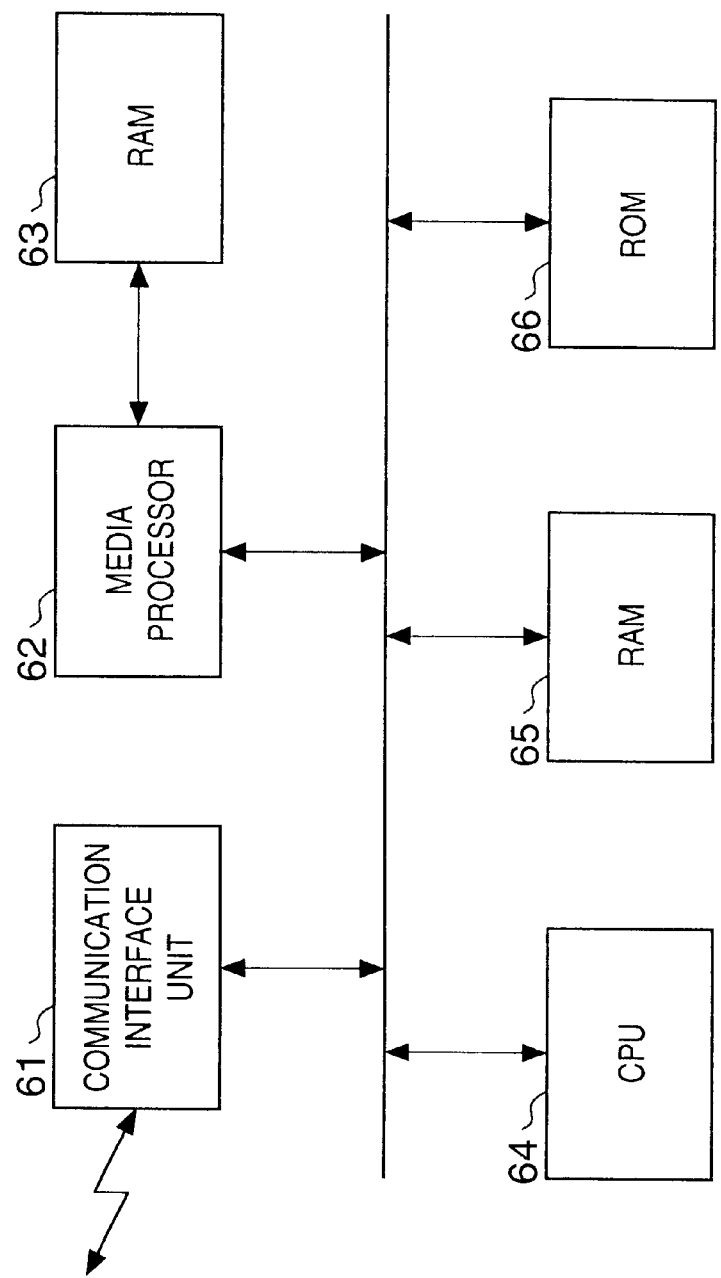
FIG. 9 is a block diagram showing the construction of the multipoint connection device according to a third embodiment of the present invention.
Figure 11:
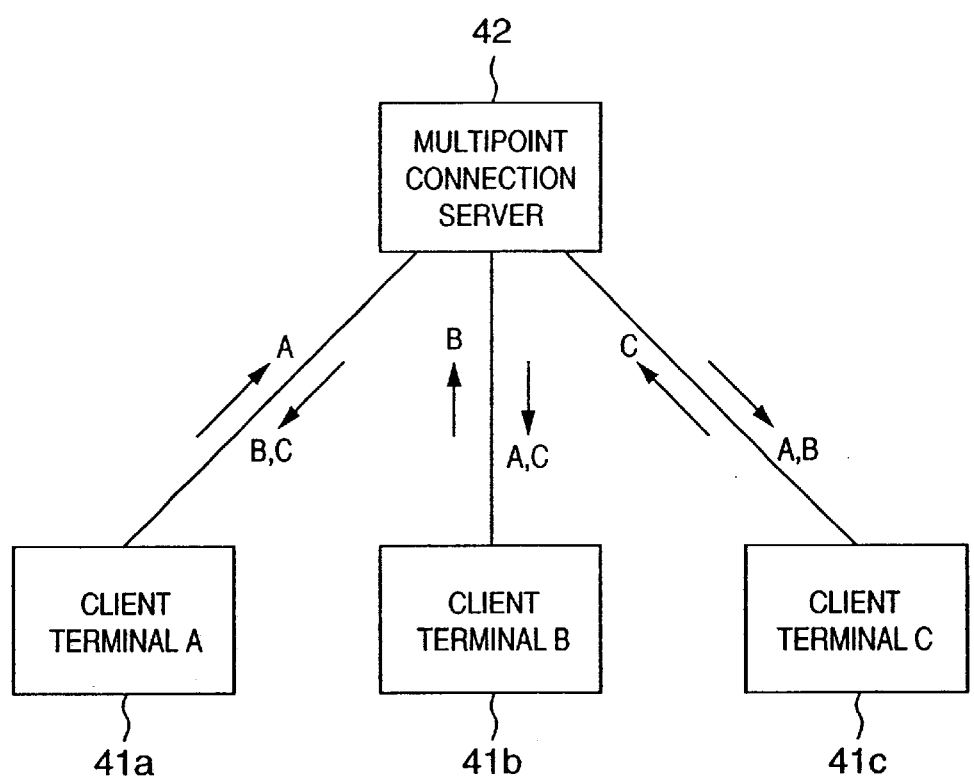
FIG. 11 is a block diagram showing an Internet-type multipoint video conference system.

FIG. 9 is a block diagram showing the construction of the multipoint connection device 22 according to the third embodiment of the present invention. Numeral 61 denotes a communication interface unit for communication with an ISDN, a PSTN and the like; and 62, a media processor which performs principal signal processings. The media processor 62 performs various digital signal processings by a specialized processor for multimedia signal processing, a DSP (Digital Signal Processor) and the like. In the third embodiment, the video conference system can be realized with a simple and low-cost construction without preparing dedicated hardware, by processing various data by multitask processing by utilizing the media processor 62.

Numeral 63 denotes a RAM (Random Access Memory) which is used as a work memory necessary for the operation of the media processor 62 and as a buffer memory for various image and audio data to be processed. The RAM 63 is realized by, e.g., a high-speed large-capacity memory such as an SDRAM (Synchronous DRAM). Numeral 64 denotes a CPU which performs system control for the multipoint connection device 22, communication protocol processing and the like; 65, a RAM used as a work buffer necessary for the operation of the CPU 64; and 66, a ROM (Read Only Memory) in which a control program necessary for the operation of the CPU 64 and a control program necessary for the operation of the media processor 62 are stored. The program necessary for the operation of the media processor 62 is transferred from the ROM 66 to the RAM 63 upon system initialization.

Figure 4:
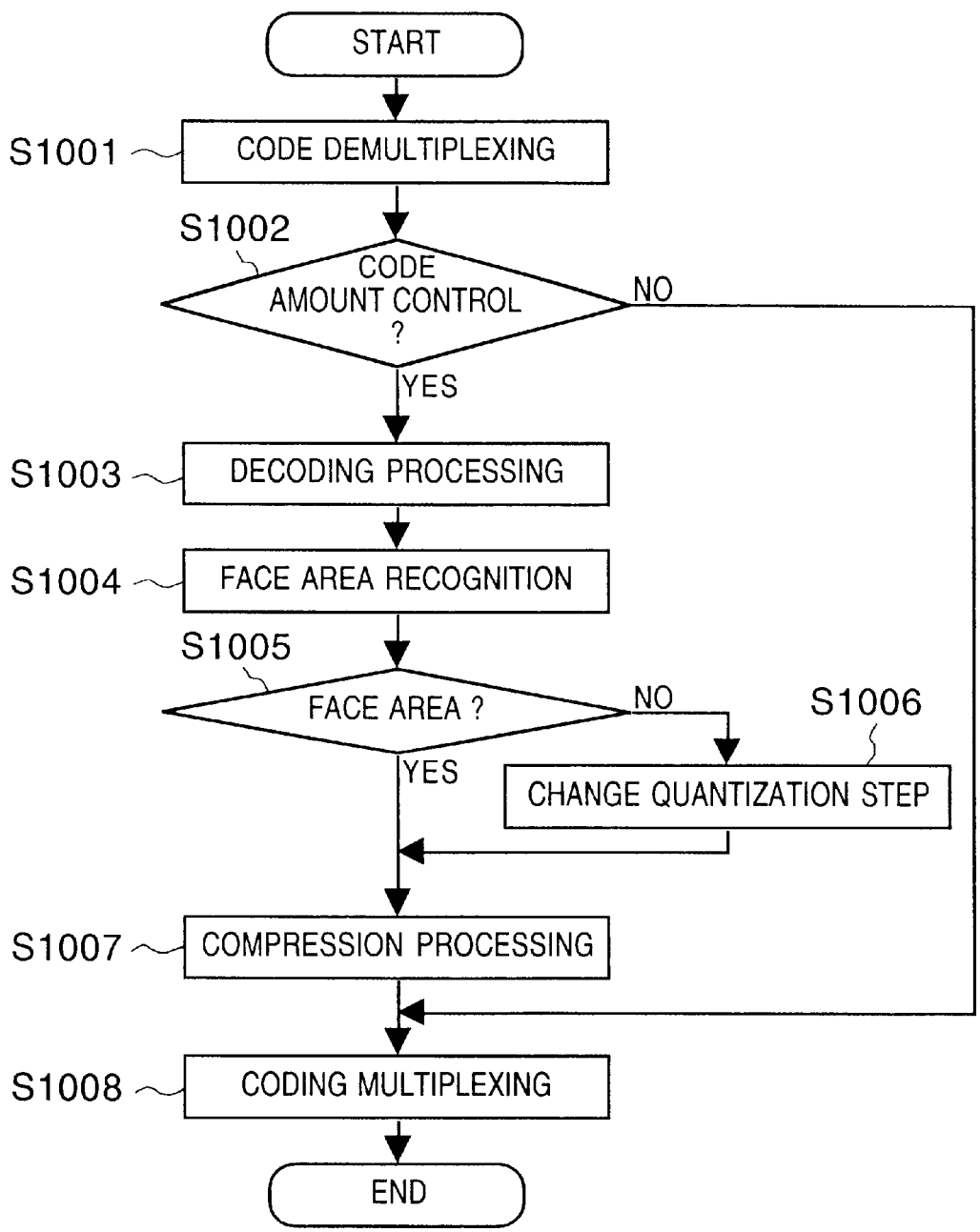
FIG. 4 is a flowchart showing image processing by the multipoint connection device.

In the third embodiment, the above construction realizes processing as shown in the flowchart of FIG. 4.

That is, a control program to realize the processing is stored in the ROM 66 in advance. The program is developed on the RAM 63 or the RAM 65, and executed by the media processor 62 or the CPU 64. For example, processing related to data compression/decompression is performed by the media processor 62, and other processings are controlled by the CPU 64.

According to the third embodiment, the same advantages as those in the first embodiment can be obtained by realizing the processings described in the first embodiment by software.

Note that in the third embodiment, the multipoint connection device 22 as described in the first embodiment is realized by software. Similarly, the multipoint connection device 22 as described in the second embodiment may be realized by software.

Note that the compression method employed in the above-described first to third embodiments may be any method. For example, an H.261 coding method or the like based on DCT (Discrete Cosine Transformation) used in the Recommendation H.320 may be used. In such case, the control on the compression method (quantization coefficients) based on the result of specific-area recognition is performed in macroblock units.

Further, the compression control method of the present invention is not limited to the quantization control or spatial filter control as described in the first to third embodiments, but any control method may be performed as long as it controls the degree of image quality degradation due to re-compression in accordance with whether or not an object area is a specific area. In other words, any control method may be used as long as it controls the compression rate in re-compression.

In addition, more flexible image quality control including further improvement in image quality of delivered image data can be realized by combining the quantization control described in the first embodiment and the spatial filter control described in the second embodiment.

Further, in the first and second embodiments, the video conference terminals are directly connected to a public line such as PSTN/ISDN line, however, the present invention is not limited to this example. The video conference terminals may be connected to the Internet, an Intranet or the like. In this case, as shown in FIG. 12, communication is performed with a plurality of terminals by the Internet Protocol via a network access controller 121 having a LAN interface such as the Ethernet. The means for communication with the respective terminals is logically constructed for each terminal. Control on packetized data and data multiplexing/demultiplexing processing are performed by the network access controller 121 and a system controller 122.

Further, the video conference terminals connected to the multipoint connection device of the present invention may be dedicated terminals or general-purpose terminals such as personal computers where a predetermined application (software) program is operated.

Further, the multipoint connection device of the present invention may have an automatic HTML (Hyper Text Markup Language) data generating function and an HTTP (Hyper Text Transfer Protocol) server function in addition to the function related to multipoint terminal connection. In this case, general-purpose communication terminals, which display and visualize image and audio data stored in the HTTP server of the multipoint connection device, can be connected to the multipoint connection device. As the general-purpose communication terminals, personal computers having a so-called WWW-browser and network computers can be employed. Further, by virtue of recent development of semiconductor technologies, these computers may be employed as quick and convenient terminals even in a mobile communication environment. These general-purpose communication terminals are IP (Internet Protocol)-connected to the multipoint connection terminal via a public network such as an ISDN or a PSTN or a LAN (Local Area Network). This enables interconnection among the existing video conference terminals and the general-purpose terminals such as personal computers and network computers.

Other Embodiment

The present invention can be applied to a system constituted by a plurality of devices (e.g., a host computer, an interface, a reader and a printer) or to an apparatus comprising a single device (e.g., a copy machine or a facsimile apparatus).

Further, the object of the present invention can be also achieved by providing a storage medium storing program code for performing the aforesaid processes to a system or an apparatus, reading the program code with a computer (e.g., CPU, MPU) of the system or apparatus from the storage medium, then executing the program.

In this case, the program code read from the storage medium realize the functions according to the embodiments, and the storage medium storing the program code constitutes the invention.

Further, the storage medium, such as a floppy disk, a hard disk, an optical disk, a magneto-optical disk, CD-ROM, CD-R, a magnetic tape, a non-volatile type memory card, and ROM can be used for providing the program code.

Furthermore, besides aforesaid functions according to the above embodiments are realized by executing the program code which are read by a computer, the present invention includes a case where an OS (operating system) or the like working on the computer performs a part or entire processes in accordance with designations of the program code and realizes functions according to the above embodiments.

Further, a product obtained by the image processing method of the present invention, e.g., printed matter, is included in the present invention.

Furthermore, the present invention also includes a case where, after the program code read from the storage medium are written in a function expansion card which is inserted into the computer or in a memory provided in a function expansion unit which is connected to the computer, CPU or the like contained in the function expansion card or unit performs a part or entire process in accordance with designations of the program code and realizes functions of the above embodiments. In a case where the present invention is applied to the aforesaid storage medium, the storage medium stores program code corresponding to the flowcharts shown in FIGS. 4 and 7 described in the embodiments.

As described above, according to the present invention, in the video conference system in a narrow band communication channel, facial expressions of the participants of a conference can be clearly displayed.

Further, upon re-compression on decompressed image data, degradation of image quality can be reduced.

As many apparently widely different embodiments of the present invention can be made without departing from the spirit and scope thereof, it is to be understood that the invention is not limited to the specific embodiments thereof except as defined in the appended claims.

What is claimed is:

1. A data communication control method in a data communication control apparatus for controlling data communication among a plurality of terminals connected to the apparatus, each of the plurality of terminals being configured to transmit and receive image data to and from the apparatus and to issue an instruction not to perform compression control in accordance with a request of a user, the method comprising the steps of:

(a) receiving image data from one of the plurality of terminals;

(b) determining whether or not compression control is performed on the received image data in accordance with the instruction;

(c) if it is determined in step (b) that the compression control is performed, (c-1) recognizing a specific area in the received image data, (c-2) controlling a compression method for compressing the received image data so as to compress the specific area and an other area of the received image data in different compression methods, respectively, and (c-3) compressing the received image data using the compression method controlled in step (c-2); and (d) transmitting the image data to at least one of the plurality of terminals.

2. The data communication control method according to claim 1, wherein quantization coefficients are controlled in step (c-2).

3. The data communication control method according to claim 1, wherein, in step (c-2), execution or non-execution of spatial filter processing on the image data is controlled.

4. The data communication control method according to claim 1, wherein, in step (c-2), coefficients of a spatial filter are controlled.

5. The data communication control method according to claim 1, wherein the specific area is an area showing a face of a person.

6. The data communication control method according to claim 1, further comprising the step of:

(c-0) if it is determined in step (b) that the compression control is performed, decompressing the compressed image data prior to performing step (c-1), wherein step (c-1) further comprises recognizing the specific area in the image data decompressed in step (c-0).

7. The data communication control method according to claim 1, wherein at least one of the plurality of terminals has an image sensing unit for obtaining image data to be transmitted, and wherein the image sensing unit can be operated from another terminal in communication with the one terminal.

8. A data communication system, in which a plurality of terminals are connected via a data communication control apparatus, for performing data communication among said plurality of terminals, wherein each of the plurality of terminals is configured to transmit and receive image data to and from said data communication control apparatus, and to issue an instruction not to perform compression control in accordance with a request of a user, said data communication control apparatus comprising:

a reception unit, adapted to receive compressed image data from one of the plurality of terminals;

a determination unit, adapted to determine whether or not compression control is performed on the received compressed image data in accordance with the instruction;

a decompression unit, adapted to decompress the compressed image data received by said reception unit if the compression control is performed;

a recognition unit, adapted to recognize a specific area in the image data decompressed by said decompression unit;

a compression control unit, adapted to control a compression method for compressing the image data so as to compress the specific area and an other area of the image data in different compression methods, respectively;

a compression unit, adapted to compress the decompressed image data by the compression method controlled by said compression control unit; and a transmission unit, adapted to transmit the compressed image data to at least one of the plurality of terminals.

9. The data communication system according to claim 8, wherein said compression control unit controls quantization coefficients.

10. The data communication system according to claim 8, wherein said compression control unit controls execution or non-execution of spatial filter processing on the image data.

11. The data communication system according to claim 8, wherein said compression control unit controls coefficients of a spatial filter.

12. The data communication system according to claim 8, wherein the specific area is an area showing a face of a person.

13. The data communication system according to claim 8, wherein at least one of said plurality of terminals has an image sensing unit, adapted to obtain image data to be transmitted, and wherein said image sensing unit can be operated from another terminal in communication with said one terminal.

14. A storage medium containing control program code in a data communication control apparatus for controlling data communication among a plurality of communication terminals connected to said apparatus, wherein each of the plurality of terminals is configured to transmit and receive image data to and from said apparatus, and to issue an instruction not to perform compression control in accordance with a request of a user, said program code including at least code of process procedures for:

(a) receiving image data from one of the plurality of terminals;

(b) determining whether or not compression control is performed on the received image data in accordance with the instruction;

(c) if it is determined in step (b) that the compression control is performed, (c-1) recognizing a specific area in the received image data, (c-2) controlling a compression method for compressing the received image data so as to compress the specific area and an other area of the received image data in different compression methods, respectively, and (c-3) compressing the received image data using the compression method controlled in process procedure (c-2); and (d) transmitting the image data to at least one of the plurality of terminals.

* * * * *